United States Patent [19]
Mellott

[11] Patent Number: 5,270,638
[45] Date of Patent: Dec. 14, 1993

[54] PROBE DEVICE FOR TESTING POLARITY OF A POWER SUPPLY AND POLARITY OF TEST ELEMENT WITH RESPECT TO THE POWER SUPPLY

[75] Inventor: James F. Mellott, Washington C.H., Ohio

[73] Assignee: Mac Tools, Inc., Columbus, Ohio

[21] Appl. No.: 773,142

[22] Filed: Oct. 8, 1991

[51] Int. Cl.$^5$ ............. G01R 19/14; G01R 19/145; G01R 31/02
[52] U.S. Cl. ............................ 324/133; 324/72.5; 324/509; 324/556
[58] Field of Search ............ 324/122, 133, 149, 509, 324/556, 72.5

[56] References Cited

U.S. PATENT DOCUMENTS

| | | | |
|---|---|---|---|
| 2,229,927 | 1/1941 | Kamper | 324/556 |
| 3,600,678 | 8/1971 | Garrett et al. | 324/72.5 X |
| 3,806,803 | 4/1974 | Hall | 324/133 |
| 4,028,621 | 6/1977 | Bloxam | 324/556 |
| 4,540,940 | 9/1985 | Nolan | 324/133 |
| 4,740,745 | 4/1988 | Sainz | 324/133 |
| 4,924,177 | 5/1990 | Mulz | 324/133 |
| 4,999,574 | 3/1991 | Stephens | 324/133 |

FOREIGN PATENT DOCUMENTS

89/06365  7/1989  World Int. Prop. O. ......... 324/133

*Primary Examiner*—Gerard R. Strecker
*Attorney, Agent, or Firm*—Porter, Wright, Morris & Arthur

[57] ABSTRACT

A device for testing the polarity of both a power supply and a test element such as a circuit, wire or the like. The device is comprised of a body which contains a circuit board, a probe extending from one end of the body, and two lead wires extending from the opposite end of the body. The device will work on any DC voltage supply having a voltage from 6 volts to 24 volts.

4 Claims, 2 Drawing Sheets

PROBE DEVICE FOR TESTING POLARITY OF A POWER SUPPLY AND POLARITY OF TEST ELEMENT WITH RESPECT TO THE POWER SUPPLY

BACKGROUND OF THE INVENTION

This invention relates to electrical testing devices and, more particularly, to hand-held devices for testing electrical circuits, wires and the like.

Prior electrical testing devices include single function test devices. These devices typically include a single probe needle or the like extending from one end of the device and a single lead wire extending from the other end of the device. A clip, such as an alligator clip, is typically joined to the lead wire and the clip is typically connected to a ground. Thus, when a circuit is probed by the probe needle, a two point connection to the circuit is established.

There are two problems with these single function test devices. First, it is often difficult to tell whether the connection to the ground is a good connection. Often, there may be paint, corrosion, rust, etc. built up on the ground and this could prevent good contact between the clip and the ground. Thus, if someone is checking a circuit when there was a poor connection between the clip and the ground, the device will not give a reading (typically indicated by an incandescent bulb or lamp) in the circuit even if the circuit does have power. It is thus sometimes difficult to distinguish between an open circuit and a grounded circuit. Second, the two point connection of these single function test devices can only give an indication of one circuit condition at a time.

SUMMARY OF THE INVENTION

The invention provides a polarity testing device comprising a body having an first and second ends, the body having electrical circuit or circuit means contained therein, a probe communicating with the electrical circuit means and extending from the first end of the body, a first power lead having a first end communicating with the electrical circuit means and extending from the second end of the body, and a second power lead having a first end communicating with the electrical circuit means and extending from the second end of the body.

The invention also provides a method for testing the polarity of a test element, such as circuit or wire, comprising the steps of connecting a first lead extending from an electrical circuit of a polarity testing device to a power source, connecting a second lead extending from the electrical circuit of the circuit testing device to a ground source, and contacting a probe extending from the electrical polarity of the circuit testing device with a circuit or wire to determine the polarity of the circuit or wire.

A principal feature of the invention is the ability of the invention to test more than one circuit condition at a given time.

Another principal feature of the invention is the improved ability of the present invention to indicate that a good ground connection exists.

Other principal features and advantages of the present invention will become apparent to those skilled in the art upon review of the following detailed description, claims and drawings.

Figure 1:
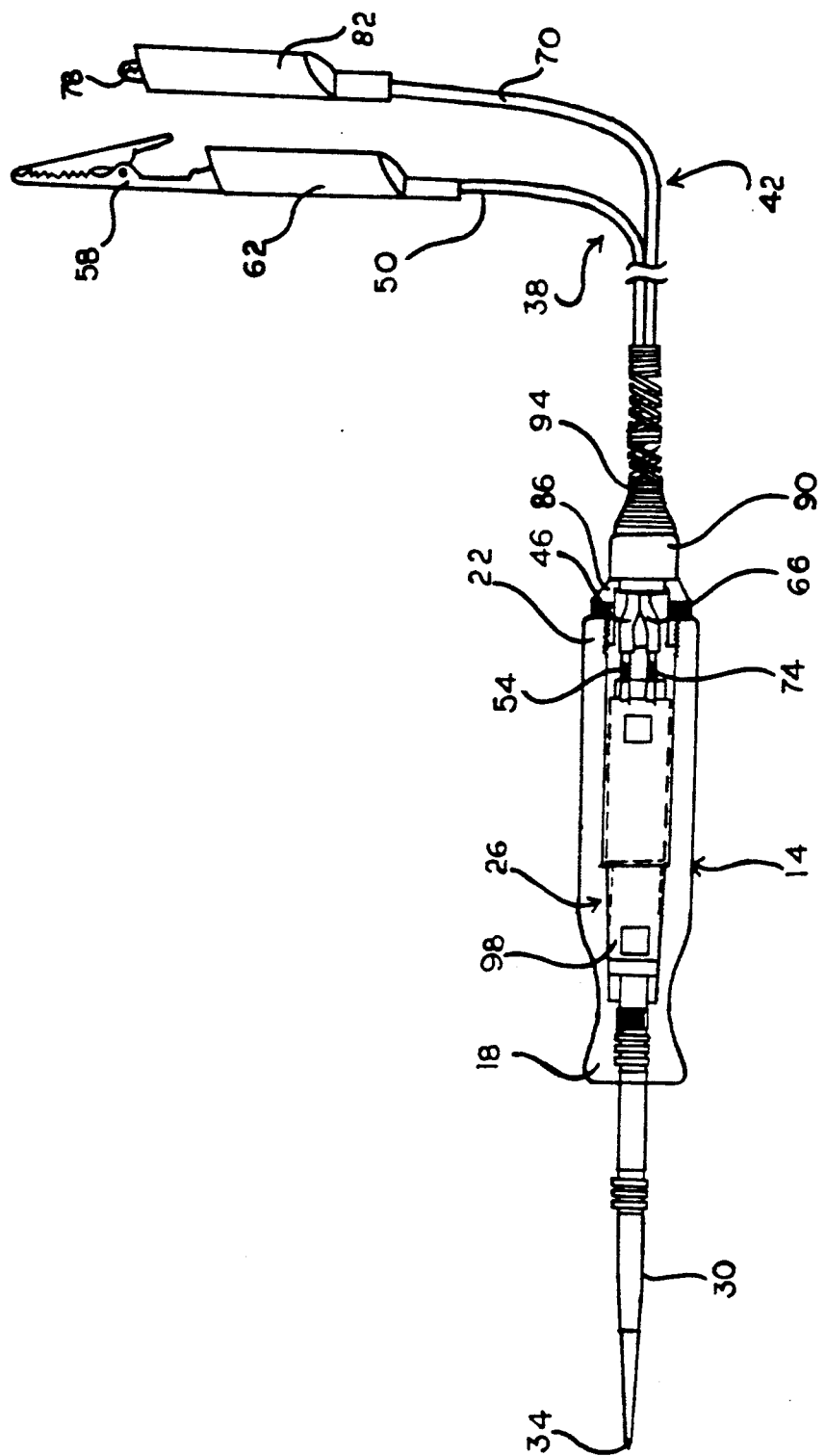
FIG. 1 is a plan view of a circuit testing device embodying the invention.

Before one embodiment of the invention is explained in detail, it is to be understood that the invention is not limited in its application to the details of construction and the arrangement of components set forth in the following description or illustrated in the drawings. The invention is capable of other embodiments and of being practiced or carried out in various ways. Also, it should be understood that the phraseology and terminology used herein is for the purpose of description and should not be regarded as limiting.

DESCRIPTION OF THE PREFERRED EMBODIMENTS

A polarity testing device 10 embodying the invention is illustrated in the drawings. Typical applications include, but are not limited to, automotive, marine and aircraft equipment. This polarity testing device 10 is designed to probe and indicate the polarity of a wire or circuit with reference to a power source for electrical systems ranging from 6 volts DC to 24 volts DC.

The device 10 is comprised of a body or handle 14 having a first end 18 and a second end 22. The body 14 contains an electrical circuit or circuit means, such as circuit board 26, which is illustrated schematically in FIG. 2 and which will be discussed in greater detail below. The body 14 is formed of a transparent material, such as cellulose acetate, so that two light emitting diodes (LEDs) on the circuit board 26 will be visible through the body 14.

A metal probe 30 extends from the first end 18 of the body 14. The probe 30 has a tip 34 which is pressed against a selected circuit point to be tested. The probe 30 is connected at the end opposite the tip to a contact on the circuit board by any suitable means.

First and second power lead wires 38 and 42 extend from the second end 22 of the body 14. The first power lead 38 has a first end 46 and a second end 50. The first end 46 of the first power lead 38 is connected to a terminal on circuit board 26 by a terminal clip 54 while the second end 50 of the first power lead 38 includes clip means, such as alligator clip 58, attached thereto which is to be connected to the circuit power source. A protective red boot 62 is attached to the first power lead 38.

The second power lead 42 likewise has a first end 66 and a second end 70. The first end 66 of the second power lead 42 is connected to a terminal on circuit board 26 by a terminal clip 74 while the second end 70 of the second power lead 42 includes clip means, such as alligator clip 78, attached thereto which is to be connected to a ground source. A protective black boot 82 is attached to the second power lead 42.

A cap 86 and bushing 90 enclose the second end 22 of the body 14. The first and second power leads 38 and 42 extend through the cap 86 and bushing 90 and through a tapered spring 94 as they exit the second end 22 of the body 14.

Figure 2:
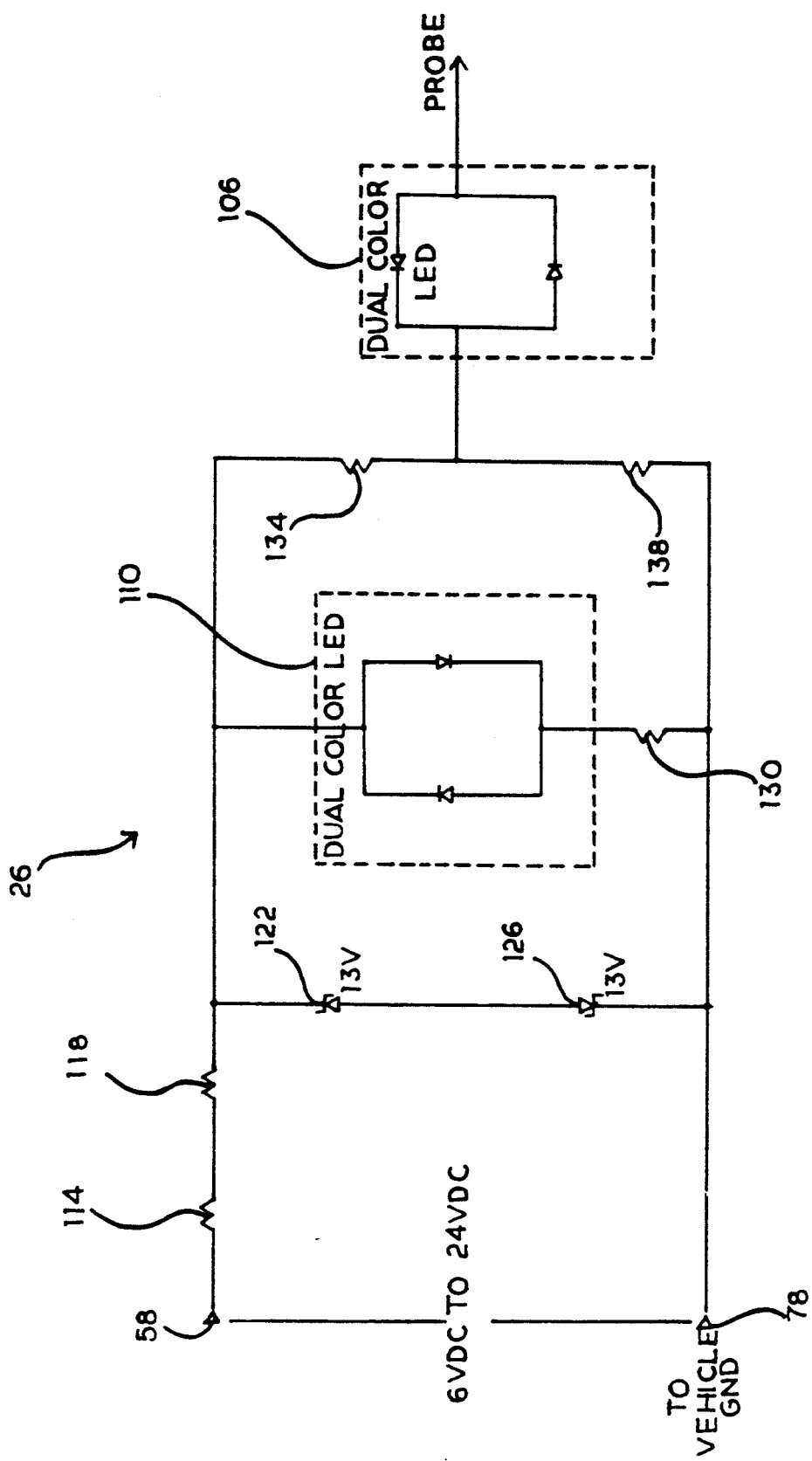
FIG. 2 is a schematic circuit diagram of the device illustrated in FIG. 1.

The circuit board 26 of the present invention is illustrated in FIG. 2. As the circuit board 26 is positioned in the body 14 of the device 10, the circuit board 26 has a first end 98 associated with the probe 30 and a second end 102 associated with the first and second power leads 38 and 42.

The circuit board 26 includes visual indicator means such as first and second LEDs 106 and 110. These LEDs 106 and 110 are preferably red and green dual color LEDs which provide a visual indication of polarity.

The circuit board 26 includes resistors 114 and 118 which provide the proper voltage to Zener diodes 122 and 126 which are connected in a back-to-back relationship. LED 110 and a resistor 130 are connected electrically in parallel across Zener diodes 122 and 126. Resistors 134 and 138 are connected electrically in parallel access LED 110 and resistor 130 and also across Zener diodes 122 and 126. Resistors 134 and 138 act as a voltage divider providing sufficient actuating voltage to LED 106 whose output is connected to the probe 30.

In operation, the alligator clip 58 of the first lead 38 is connected to a ground source and the alligator clip 78 of the second lead 42 is connected to a power source. When the connections are made, the power (top) LED 110 will be red. If the two leads are reversed, the power LED 110 will be green. When the power LED is on, a good ground connection and a good power source connection are present. This eliminates any testing with a questionable ground connection. This is an advantage over the prior single function tester because the single function tester had only a single connection to a ground and it was sometimes hard for a user to tell whether the connection to the ground was good in the absence of any indication by the single function test that good ground had been established. The extra connection going across the power source in the present invention allows a user to determine whether a good ground connection exists before any testing is begun.

After a good ground connection is established the tip 34 of the probe 30 is pressed against a selected circuit point, wire, or the like, to be tested. The probe 30 can be utilized with either a positively grounded electrical system or a negatively grounded electrical system. The test LED 106 indicates the polarity of the voltage probed by the probe 30.

In a negatively grounded system, clip 58 is to be connected to the positive terminal, of the voltage supply and clip 78 is to be connected to the negative terminal. LED 110 will turn red and remain red so long as clips 58 and 78 are connected. Under this situation, when a circuit is probed by the probe 30 and the probe 30 contacts a positive voltage, LED 106 will turn red and LED 110 will remain red. If the probe 30 contacts a negative voltage, LED 106 will turn green and LED 110 will remain red. If the probe 30 is not connected to a voltage source or ground, LED 106 will not be lit and LED 110 will remain red.

In a positively grounded system, clip 58 is to be connected to the negative terminal and clip 78 is to be connected to the positive terminal. LED 110 will turn green and remain green so long as clips 58 and 78 are connected. Under this situation, when a circuit is probed by the probe 30 and the probe contacts a positive voltage, LED 106 will turn red and LED 110 will remain green. If the probe 30 contacts a negative voltage, LED 106 will turn green and LED 110 will remain green. If the probe is not connected to a voltage source, or ground LED 106 will not be lit and LED 110 remain green.

This device 10 will work on any type of DC voltage supply having a voltage from 6 volts to 24 volts.

Various features of the invention are set forth in the following claims.

What is claimed is:

1. A polarity testing device, comprising:
    a body;
    a probe extending from said body;
    a first power lead extending from said body; and
    a second power lead extending from said body; and
    an electrical circuit contained within said body, said electrical circuit comprising a first node connected to said first lead, a second node connected to said second lead, a first LED connected to said first and second nodes, a voltage divider connected to said first and second nodes in parallel relationship to said first LED, such that when said first and second leads are connected across the terminals of a power supply, said first LED determines and indicates the polarity of the power supply, and a second LED, said second LED connected between a center tap of said voltage divider and said probe, such that when said first and second leads are connected across the terminals of a power supply and said probe contacts a test element having a potential, said second LED determines and indicates the polarity of the test element with respect to the polarity of the power supply.

2. The device of claim 1, wherein said first and second power leads comprise first and second ends, said first ends connecting to said nodes and said second ends comprising clip means.

3. The device of claim 1, wherein said body is formed of a transparent material.

4. A method for testing the polarity of a test element, comprising the steps of:
    connecting a first led extending from a polarity testing device to a power source;
    connecting a second lead extending from said device to a ground source; and
    contacting a test element with a probe extending from said device, said device comprising an electrical circuit having a first node connected to said first lead, a second node connected to said second lead, a first LED connected to said first and second nodes, a voltage divider connected to said first and second nodes in parallel relationship to said first LED, such that when said first and second leads are connected across the terminals of a power supply, said first LED determines and indicates the polarity of the power supply, and a second LED, said second LED connected between a center tap of said voltage divider and said probe, such that when said first and second leads are connected across the terminals of a power supply and said probe contacts a test element having a potential, said second LED determines and indicates the polarity of the test element with respect to the polarity of the power supply.

* * * * *